(12) United States Patent
Hammerschmidt

(10) Patent No.: US 8,994,526 B2
(45) Date of Patent: Mar. 31, 2015

(54) SENSOR INTERFACE MAKING USE OF VIRTUAL RESISTOR TECHNIQUES

(75) Inventor: Dirk Hammerschmidt, Villach (AT)

(73) Assignee: Infineon Technologies AG, Neubiberg (DE)

( * ) Notice: Subject to any disclaimer, the term of this patent is extended or adjusted under 35 U.S.C. 154(b) by 807 days.

(21) Appl. No.: 13/212,463

(22) Filed: Aug. 18, 2011

(65) Prior Publication Data
US 2013/0043908 A1 Feb. 21, 2013

(51) Int. Cl.
G08B 1/08 (2006.01)
H03K 5/22 (2006.01)
H04Q 9/00 (2006.01)

(52) U.S. Cl.
CPC .. *H03K 5/22* (2013.01); *H04Q 9/00* (2013.01); *H04Q 2209/30* (2013.01); *H04Q 2209/88* (2013.01)
USPC .................... 340/533; 340/572.1; 340/636.13

(58) Field of Classification Search
USPC .......... 340/533, 534, 538.11, 538.12, 538.14, 340/539.21–539.22, 538.15, 568.1, 571, 340/572.1, 636.11–636.13
See application file for complete search history.

(56) References Cited

U.S. PATENT DOCUMENTS

| | | | |
|---|---|---|---|
| 3,761,841 A * | 9/1973 | Jacquart | 341/143 |
| 4,755,816 A | 7/1988 | DeLuca | |
| 5,468,126 A | 11/1995 | Lukich | |
| 5,550,498 A | 8/1996 | Kwan et al. | |
| 5,677,618 A | 10/1997 | Fiez et al. | |
| 5,731,694 A | 3/1998 | Wilcox et al. | |
| 6,064,327 A | 5/2000 | Ryoho et al. | |
| 6,362,702 B1 | 3/2002 | Nielsen et al. | |
| 6,556,144 B1 | 4/2003 | Roberts et al. | |
| 6,608,566 B1 * | 8/2003 | Davis | 340/870.11 |
| 6,831,431 B1 | 12/2004 | Dieterle et al. | |
| 7,649,345 B2 | 1/2010 | Kwan | |
| 7,773,016 B2 | 8/2010 | Miao | |

(Continued)

FOREIGN PATENT DOCUMENTS

| | | |
|---|---|---|
| CN | 1451140 A | 10/2003 |
| CN | 101435724 A | 5/2009 |

(Continued)

OTHER PUBLICATIONS

U.S. Appl. No. 13/430,015, filed Mar. 26, 2012. 35 Pages.

(Continued)

*Primary Examiner* — Daniel Previl
(74) *Attorney, Agent, or Firm* — Eschweiler & Associates, LLC (57) ABSTRACT

Some embodiments of the present disclosure relate to a sensor interface module. The sensor interface module includes a comparator having a first comparator input, a second comparator input, and a comparator output. A current- or voltage-control element has a control terminal coupled to the comparator output and also has an output configured to deliver a modulated current or modulated voltage signal to an output of the sensor interface module. A first feedback path couples the output of the current- or voltage-control element to the first comparator input. A summation element has a first summation input, a second summation input, and a summation output, wherein the summation output is coupled to the second comparator input. A supply voltage module provides a supply voltage signal to the first summation input. A second feedback path couples the comparator output to the second summation input.

20 Claims, 8 Drawing Sheets

(56) References Cited

U.S. PATENT DOCUMENTS

| | | | |
|---|---|---|---|
| 8,497,712 B2* | 7/2013 | Nguyen et al. | 327/73 |
| 8,710,963 B2 | 4/2014 | Hammerschmidt | |
| 8,872,392 B1 | 10/2014 | Gurunathan et al. | |
| 2002/0125872 A1 | 9/2002 | Groom et al. | |
| 2003/0023328 A1 | 1/2003 | Yasui | |
| 2005/0194951 A1 | 9/2005 | Mehas et al. | |
| 2007/0108953 A1 | 5/2007 | Latham | |
| 2008/0123815 A1 | 5/2008 | Feda | |
| 2008/0300750 A1 | 12/2008 | Davis et al. | |
| 2008/0310200 A1 | 12/2008 | Maksimovic et al. | |
| 2009/0076760 A1 | 3/2009 | Schumacher et al. | |
| 2009/0205436 A1 | 8/2009 | Garverick et al. | |
| 2009/0237282 A1* | 9/2009 | Hartlieb et al. | 341/143 |
| 2009/0241499 A1 | 10/2009 | Maertens et al. | |
| 2009/0302815 A1 | 12/2009 | Tanzawa | |
| 2009/0319060 A1 | 12/2009 | Wojsznis et al. | |
| 2010/0264895 A1 | 10/2010 | Weng et al. | |
| 2011/0309916 A1 | 12/2011 | Mueller et al. | |
| 2012/0056642 A1 | 3/2012 | Song et al. | |
| 2012/0081085 A1 | 4/2012 | Miyamae | |
| 2012/0101595 A1* | 4/2012 | Jung et al. | 623/25 |
| 2012/0153917 A1* | 6/2012 | Adell et al. | 323/283 |
| 2012/0212197 A1 | 8/2012 | Fayed et al. | |
| 2012/0249093 A1 | 10/2012 | Grbo et al. | |
| 2012/0307229 A1 | 12/2012 | Conroy et al. | |
| 2013/0033357 A1 | 2/2013 | Hammerschmidt | |
| 2013/0043908 A1 | 2/2013 | Hammerschmidt | |
| 2013/0063166 A1 | 3/2013 | Ng et al. | |
| 2013/0229197 A1 | 9/2013 | Kusaka et al. | |
| 2013/0342185 A1 | 12/2013 | Kunihiro et al. | |
| 2014/0077982 A1 | 3/2014 | Wu et al. | |
| 2014/0266121 A1 | 9/2014 | Wee et al. | |

FOREIGN PATENT DOCUMENTS

| | | |
|---|---|---|
| CN | 101806602 A | 8/2010 |
| CN | 101919148 A | 12/2010 |
| CN | 201732261 U | 2/2011 |
| DE | 3912439 A1 | 10/1990 |
| DE | 4228047 A1 | 4/1993 |
| DE | 10340431 A1 | 4/2004 |
| DE | 102008041030 A1 | 2/2010 |

OTHER PUBLICATIONS

U.S. Appl. No. 14/248,668, filed Apr. 9, 2014.
Office Action dated Apr. 25, 2013 for U.S. Appl. No. 13/430,015.
Infineon Technologies. "Differential Two-Wire Hall Effect Sensor IC." Published in Feb. 2002. 18 Pages.
Discrete Semiconductors. "Rotational Speed Sensor for Extended Air Gap Application and Direction Detection." Published on Sep. 4, 2004. 16 Pages.
Infineon Technologies. "TLE4941/4941C Smart Hall Effect ICs for Active Wheel Speed Sensing." Published in 2006. 2 Pages.
U.S. Appl. No. 13/908,389, filed Jun. 3, 2013. 47 Pages.
Office Action Dated Jun. 20, 2014 U.S. Appl. No. 13/197,288.
MICREL : MIC 184 Local/Remote Thermal Supervisor. Firmenschrift, Micrel, Inc. : Data Sheet MIC184, May 2006. San Jose: Micrel, 2006. 20 Pages.
Hägglund, Tore : New Estimation Techniques for Adaptive Control. Doctoral Dissertation, The Swedish Board for Technical Development (STU), Document Number : CODEN : LUTFD2/(TFRT-1025)/ 1-120/(1983). Lund, Sweden : Lund University, Department of Automatic Control, Dec. 1983. 118 Pages.
Office Action dated Jun. 26, 2013 for U.S. Appl. No. 13/046,891.
Tietze, U. et al. "Electronic Circuits: Design and Applications." ISBN 3-540-50608-X. Berlin, Heidelberg ; New York : Springer. Kapitel 23.6 1-23.8 : AD-Umsetzer, S. Published in 1991. pp. 690-711.
U.S. Appl. No. 13/046,891, filed Mar. 14, 2011. 35 Pages.
Dahono, Pekik Argo. "A Control Method for DC-DC Converter That Has an LCL Output Filter Based on New Virtual Capacitor and Resistor Concepts." 2004 35th Annual IEEE Power Elecfronics Specialists Conference. 7 Pages.
DSI3 Bus Standard. Jul. 2, 2010. 46 Pages.
Wessels, Christian, et al. "Active Damping of LCL-Filter Resonance based on Virtual Resistor for PWM Rectifiers—Stability Analysis with Different Filter Parameters." Insitute of Power Electronics and Electrical Drives Kaiserstr. 2, 24143 Kiel, Germany. 7 Pages.
U.S. Appl. No. 13/197,288, filed Aug. 3, 2011. 22 Pages.
Non-Final Office Action dated Nov. 8, 2013 for U.S. Appl. No. 13/430,015. 22 Pages.
Notice of Allowance dated Dec. 16, 2013 for U.S. Appl. No. 13/046,891. 24 Pages.
Notice of Allowance Dated Jun. 3, 2014 U.S. Appl. No. 13/430,015.
Final Office Action Dated Jan. 16, 2015 U.S. Appl. No. 13/197,288.

* cited by examiner

SENSOR INTERFACE MAKING USE OF VIRTUAL RESISTOR TECHNIQUES

BACKGROUND

Modern vehicles include a vast array of sensors, such as air bag sensors, tire pressure sensors, engine sensors, seat belt sensors, and many others. The engine sensors, for example, can provide data about the vehicle's engine cycle to an engine control unit (ECU). Based on the data from the engine sensors, the ECU can then make changes to the engine cycle (e.g., spark plug timing and/or fuel injection parameters) to optimize engine performance.

As the number of vehicular sensors increases, integration is becoming a serious challenge for automakers. For example, wires connecting an ECU to its corresponding engine sensors can be several meters long. These wires are a significant cost factor in automotive systems and contribute to the overall weight of the vehicle. Because of this, some conventional wiring interfaces, such as PSI5 and DSI for example, limit the number of wires to two lines. These interfaces can be used in automotive airbag sensors, power train systems, and non-standardized pulse width modulated (PWM) protocols of ABS wheel speed sensors, among others.

As the inventors have appreciated, however, conventional sensor interfaces are less than ideal for several reasons. Therefore, the inventors have devised improved sensor interfaces as described further herein.

DETAILED DESCRIPTION

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details.

Aspects of the present disclosure are directed towards a sensor interface module that delivers a supply voltage to a plurality of sensors, and which exchanges data signals between the plurality of sensors and a controller (e.g., an ECU). The sensor interface often employs a virtual resistor, rather than an actual resistor, to limit power consumption and manufacturing costs. Whereas a first feedback path helps to tune the output of the sensor interface to a target signal (e.g., first control signal from a control unit), the virtual resistor can be disposed on a second feedback path in the form of a multiplier, for example. Compared to a sensor interface module with an actual resistor, the sensor interface module with the virtual resistor limits manufacturing costs and power consumption.

Figure 1:
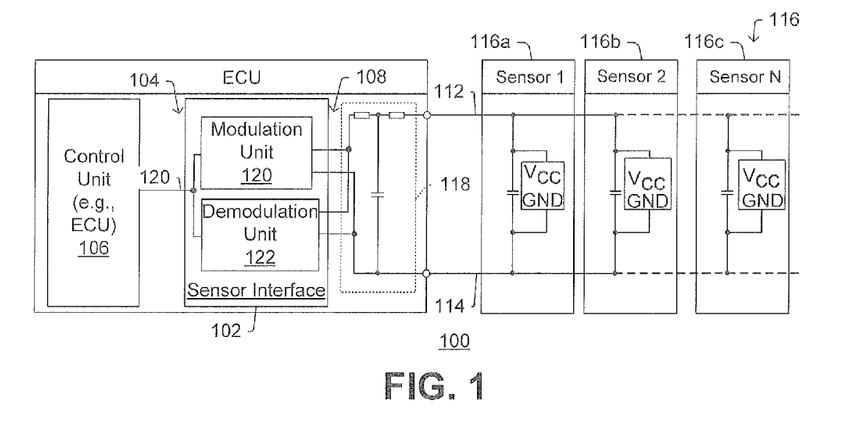
FIG. 1 is a block diagram of a vehicular sensing system in accordance with some embodiments.

To better appreciate some aspects of the present disclosure, FIG. 1 shows a vehicular sensing system 100 including a sensor interface module 102 in accordance with some embodiments. On one side, the sensor interface module 102 has a control unit interface 104 coupled to a control unit 106 (e.g., ECU); and on the other side, the sensor interface module 102 has a sensor interface 108 coupled to a pair of wires 112, 114. The pair of wires are coupled to a number of sensors 116 (e.g., 116a, 116b, . . . 116c). To limit noise and attenuate the line resonance, an RC filter 118 is coupled to the sensor interface 108.

To transmit information to the sensors 116, the sensor interface 102 includes a modulation unit 118, which modulates a supply voltage (e.g., a DC supply voltage) to transmit information to at least one of the sensors 116. To receive information from the sensors 116, the sensor interface includes a demodulation unit 120, which demodulates a modulated current signal to receive information from at least one of the sensors 116.

Figure 2:
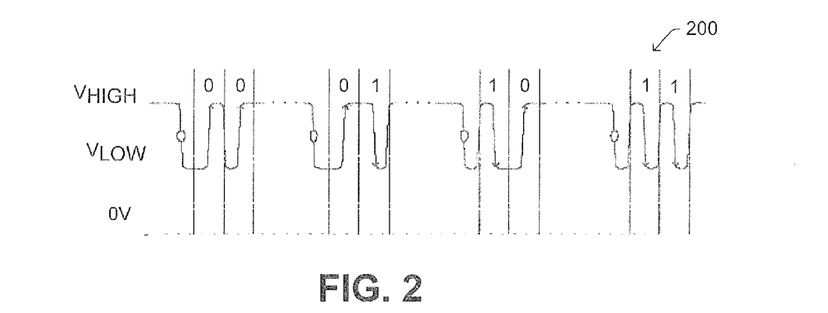
FIG. 2 is a waveform diagram of a modulated voltage signal that can be transmitted to sensors of a vehicular sensing system.

FIG. 2 shows one example of how a modulation unit (e.g., modulation unit 120 in FIG. 1) can transmit a modulated voltage signal 200 to a sensor. The modulated voltage signal 200 is transmitted to vary between a high supply voltage ($V_{HIGH}$) and a low supply voltage ($V_{LOW}$). In FIG. 2's example, a rising edge voltage transition corresponds to a logical "0" and a falling edge voltage transition corresponds to a logical "1", although other encoding schemes could also be used. When data is not transmitted, the modulation unit often provides an un-modulated (e.g., DC) supply voltage to the sensors, thereby powering the sensors via the pair of wires and without the use of other dedicated power routing lines.

Figure 3:
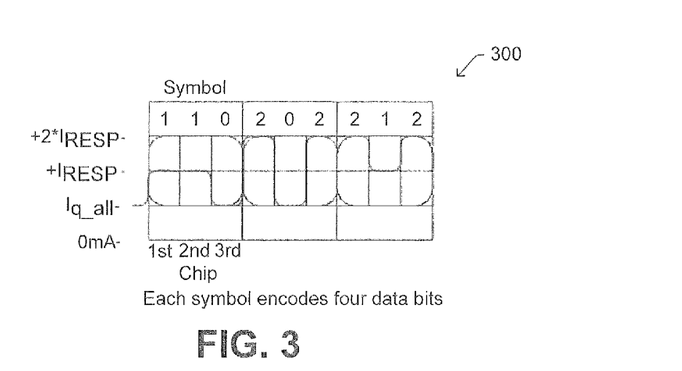
FIG. 3 is a waveform diagram of a modulated current signal that can be transmitted from a sensor of a vehicular sensing system.

FIG. 3 shows one example of how a demodulation unit (e.g., demodulation unit 122 in FIG. 1) can evaluate a modulated current signal 300 to decode information transmitted by a sensor. In FIG. 3's example, data bits can be encoded as symbols on the modulated current signal 300, wherein each symbol is made up of three chips and encodes four data bits. The demodulation unit can digitally sample the modulated current signal 300 to discern which of the symbols has been transmitted within a given symbol period, thereby decoding the digital bitstream transmitted by the sensor.

Figure 4:
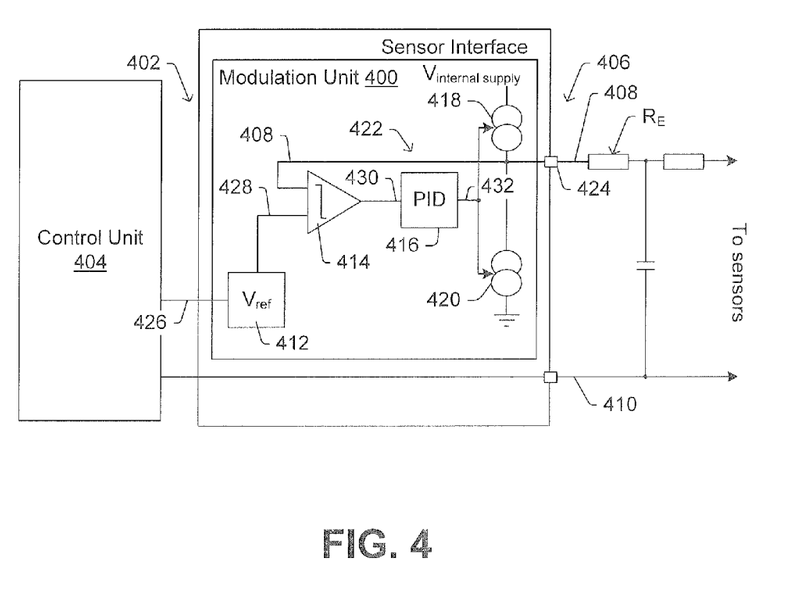
FIG. 4 is a block diagram of a sensor interface module that includes an actual resistor and which suffers from some shortcomings.

FIG. 4 shows a more detailed view of a modulation unit 400 (e.g., modulation unit 120 of FIG. 1) that suffers from some shortcomings. As can be seen from FIG. 4, on one side, the modulation unit 400 includes a control unit interface 402 that interfaces to a control unit 404. On the other side, the modulation unit 400 includes a sensor interface 406, which interfaces to the pair of wires 408, 410 coupled to the sensors. The modulation unit 400 includes a voltage supply 412, which is coupled to a first input of comparator 414. An output of the comparator 414 is coupled to a PID controller 416. An output of the PID controller 416 is, in turn, coupled to first and second digitally controlled current sources 418, 420. A feedback path 422 couples an output node 424 of the modulation unit 400 back to a second input of the comparator 414.

During operation, the modulation unit 400 can change its output voltage on output node 424 based on a first control signal 426 from control unit 404. In particular, this first control signal on 426 sets a target voltage on the first comparator input 428. The comparator 414 then adjusts its error signal voltage level on 430 (which sets a second control signal 432 output by the PID controller 416) until the modulation unit's output voltage on output node 424 matches the target voltage on 428. In short, the modulation unit 400 receives a first control signal on 426, and regulates its output voltage on output node 424 such that the output voltage tracks the first control signal 426, thereby transmitting the desired information to the sensors.

Although FIG. 4's architecture is sufficient in some respects, it does suffer from some shortcomings. For example, the PID controller 416 in this configuration cannot easily account for different inductances and/or capacitances due to wiring differences for different vehicles. For example, one vehicle may require relatively long wires (e.g., large capacitance and inductance), while another vehicle may require relatively short wires (e.g., small capacitance and inductance). From a manufacturing viewpoint, it is desirable for a single PID controller to be interchangeable with these different vehicles. However, the wide range of load conditions for the different vehicles (e.g., large range of capacitances and inductances) makes it difficult for single PID controller with fixed component dimensions to work interchangeably with these vehicles.

Figure 5:
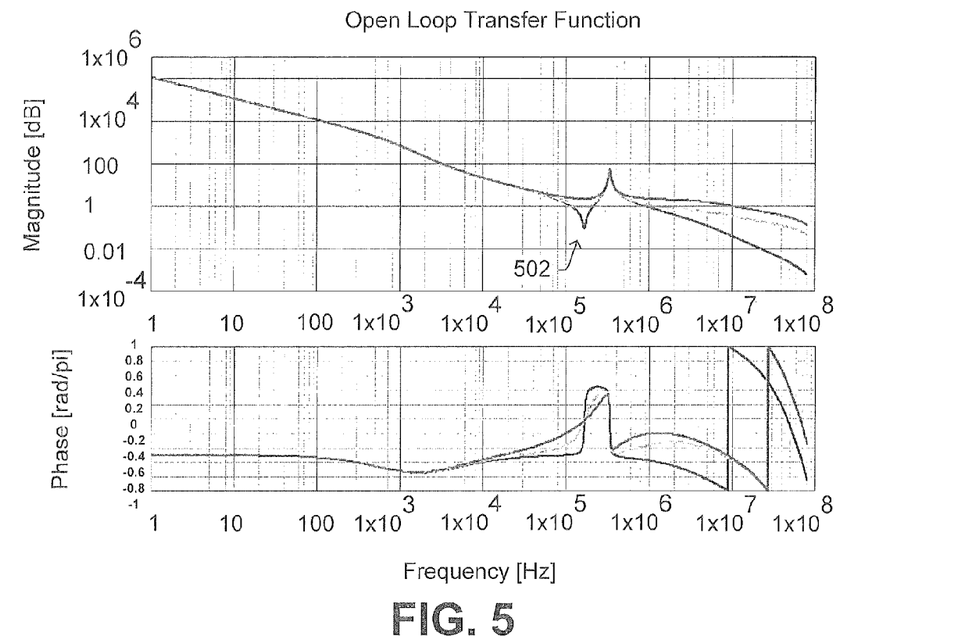
FIGS. 5-6 are waveform diagrams showing how the sensor interface module of FIG. 4 may exhibit undesirable attenuation at a resonant frequency of the wiring network.

Further, even within a given vehicle, the capacitance and inductance of the fixed wiring network can give rise to undesirable resonant frequencies. For example, FIG. 5 shows an open loop transfer function for a resistor-inductor-capacitor (RLC) circuit inserted between an RC filter (e.g., 118 in FIG. 1) and its corresponding sensors (e.g., 116 in FIG. 1) when FIG. 4's modulation unit is used. For FIG. 5's open loop transfer function the inductor and capacitors have fixed values, and the different curves correspond to different resistor values (blue $R_E=0\Omega$, green $R_E=4\Omega$, red $R_E=12\Omega$). There is a noticeable drop in the open loop gain at a serial resonance frequency 502, wherein the magnitude of this drop depends on the size of resistor $R_E$. Typically, smaller resistors correspond to larger signal attenuations.

Figure 6:
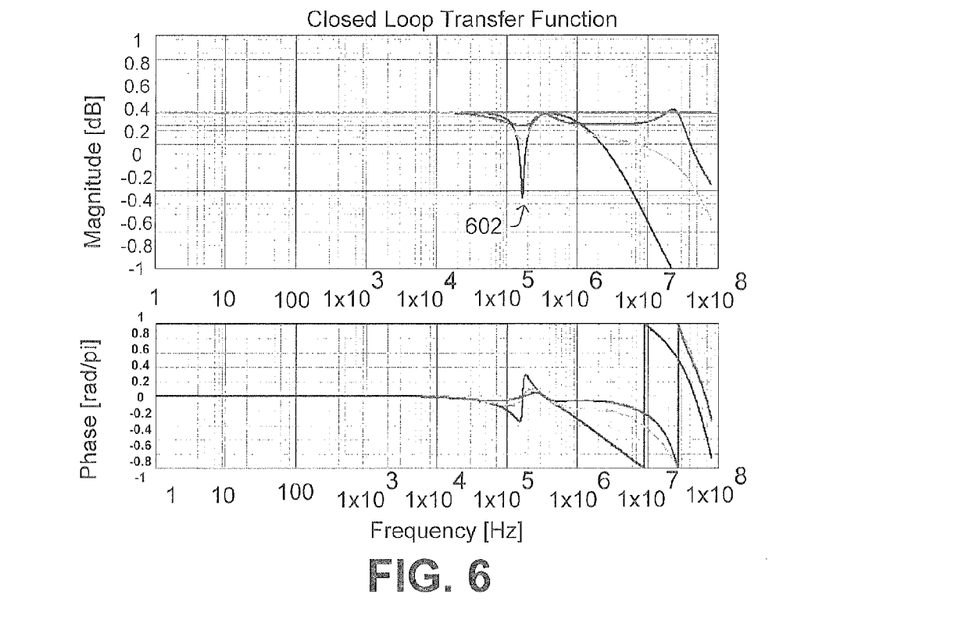

FIG. 6 shows a corresponding closed loop transfer function for the same settings as FIG. 5. As can be seen, an un-damped serial resonance causes severe distortions to signals at resonant frequency 602, which is in a frequency band between 100 KHz and 2 MHz that may be used for communication between a control unit and its corresponding sensors in many implementations. In order to accurately and reliably communicate signals, the closed loop transfer function should provide a constant gain and minimum phase shift in the band of the transmission signals. As can be inferred from FIGS. 5-6, higher resistance values tend to provide better signal quality relative to low resistance values. Thus, one might think that using a large discrete resistor $R_E$ would be preferred. However, the inventors have appreciated that the cost of using a large resistor $R_E$ is not negligible from a manufacturing perspective, and such a resistor will consume a significant amount of power during operation.

Figure 7:
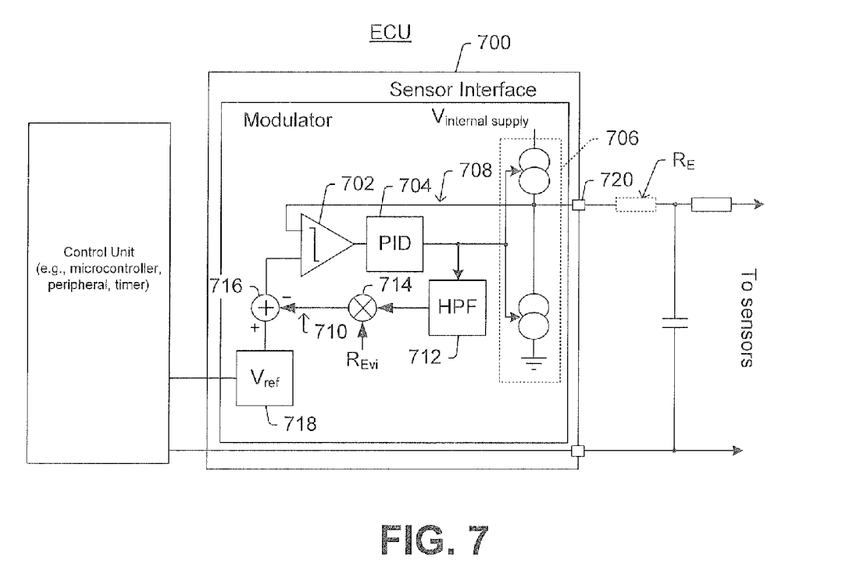
FIG. 7 is a block diagram of a block diagram of a sensor interface module in accordance with some embodiments.
Figure 8:
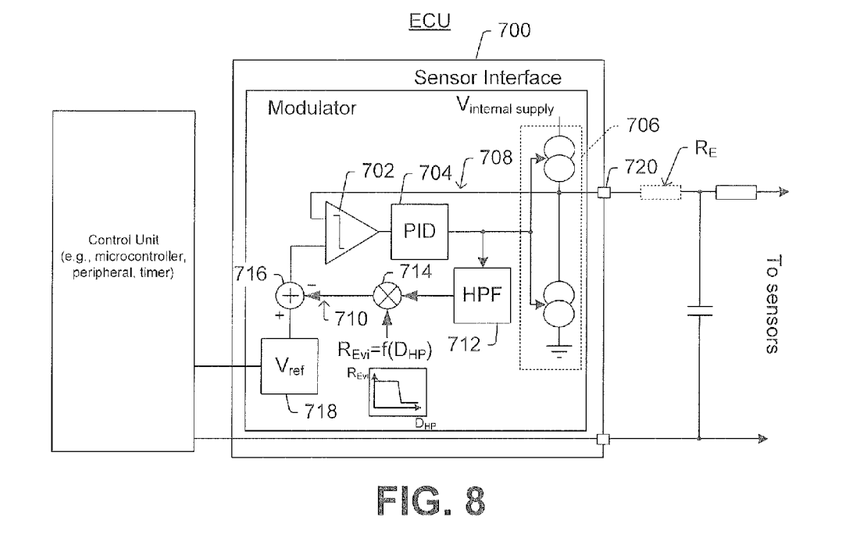
FIG. 8 is a block diagram of a block diagram of a sensor interface module in accordance with another embodiment.
Figure 9:
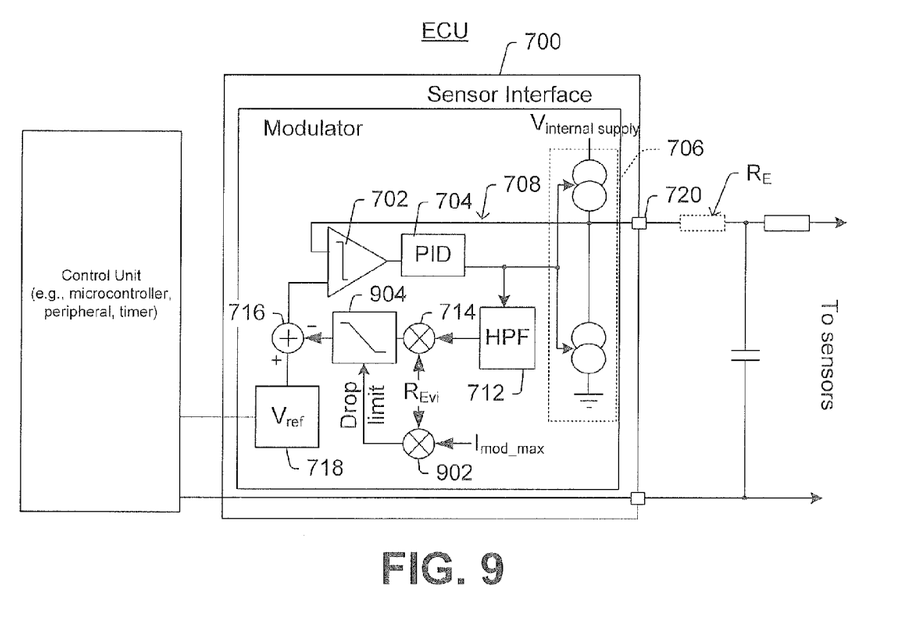
FIG. 9 is a block diagram of a block diagram of a sensor interface module in accordance with another embodiment.

To limit these shortcomings, the inventors have developed improved sensor interfaces that make use of a virtual resistor. In particular, rather than using a large resistor $R_E$ having an non-negligible manufacturing cost and non-negligible power consumption, aspects of the present disclosure make use of a virtual resistor scheme whereby the modulation unit modulates its power to emulate the behavior of an actual resistor (albeit without using an actual resistor or by using a relatively small resistor). FIGS. 7-9 show embodiments of sensor interfaces that make of such virtual resistor techniques.

FIG. 7 shows a sensor interface module 700 in accordance with some aspects of the present disclosure. In addition to a comparator (or analog to digital converter (ADC)) 702, a PID controller 704, and a current- or voltage-control element 706, which are operably coupled via a first feedback path 708; the sensor interface module also includes a second feedback path 710 that facilitates the virtual resistance functionality. The second feedback path 710 includes a high pass filter 712, a multiplier 714, and a summation element 716, which are operably coupled as shown. An output of the multiplier 714 is coupled to a first summation input of the summation element 716. A supply voltage module 718 has its output coupled to the second summation input. The summation output is coupled to an input of the comparator 702.

In this configuration, the output of the PID controller 704 is directly controlling the current- or voltage-control element 706 (and thus the current and voltage on the output node 720). Hence, the digital output signal of the PID controller 704 is directly proportional to the current on the output node 720. In order to get the voltage drop that would be caused by an actual resistor $R_E$ (if such a resistor were in place as shown in FIG. 4), the multiplier 714 multiplies the PID controller output (current) with a virtual resistance value $R_{EVT}$. In the summation element 716, this product is subtracted from the target signal provided by the supply voltage 718. As a result of this additional feedback/virtual resistance, the output of the modulation unit on 720 decreases proportionally with the current consumption of the load—just as it would do if a real resistor were inserted in the current path. However, because FIG. 7's solution can omit resistor $R_E$ or use a smaller resistor $R_E$ than previously used, FIG. 7's modulation unit potentially offers cost savings and power savings relative to previous implementations.

In FIG. 7's embodiment, the virtual resistance value $R_{EVT}$ is a fixed digital value. For example, the virtual resistance value $R_{EVT}$ could be a 16-bit digital value, wherein a larger virtual resistance value emulates a larger actual resistor and a smaller virtual resistance value emulates a smaller actual resistor.

Once the behavior of the resistor is modeled digitally it is easy to bypass this virtual resistance functionality for frequencies which are below the frequency range which is of interest for the data transmission or frequencies that are in the range of the line resonance and need damping. For example, if data is to be transmitted in a frequency band between 100 KHz and 2 MHz, the high pass filter 712 could be set to pass only frequencies of 100 kHz or greater, such that frequencies less than 100 kHz are attenuated, thereby rendering the product from multiplier 714 a zero value for frequencies less than 100 kHz. In this way, the high pass filter 712 emulates a source impedance consisting of a resistor which is dominant in the high frequency range and a coil that bypasses the resistor at lower frequencies. Another option would be to replace the high pass filter 712 with a band pass if a lower impedance at high frequencies is desirable. In general it is possible to emulate any kind of impedance that has a frequency dependence that can be modeled using a digital filter.

FIG. 8 shows another embodiment wherein the virtual resistance value $R_{EVT}$ varies as a function (e.g., a non-linear function) of the modulated current signal output on 720. For example, in some embodiments a higher virtual resistance value can be used as long as the modulated current is in a normal operation range, and a lower virtual resistance value can be used if the modulated current exceeds this normal operation range. This feature can be important for sensor interfaces, since it is often desirable to keep the supply voltage of the sensor above a certain limit—otherwise the sensor goes into power-on reset and restarts after the supply recovers. This restart of the sensor can include a long initialization sequence including self-tests and transmission of a sequence of startup messages and during this time the ECU is blind, which is undesirable especially for a safety relevant system like an airbag, which requires a high availability.

FIG. 9 shows one embodiment of another modulation unit 900 illustrating how a gain current dependent virtual source impedance can be used to limit the tolerable voltage drop. In this example, a second multiplier 902 receives a maximum modulation current signal ($I_{mod\_max}$) and multiplies it with the virtual resistor value ($R_{EVI}$). A voltage drop limiting element 904 than limits the voltage drop based on the product output by the second multiplier. In this case it is assured that signals that are expected to be caused by the modulated current signal are affected by the virtual resistor as desired, but signals that would exceed the tolerable voltage drop see a resistance that continuously decreases with the increase of the difference between the actual modulated current signal and the maximum modulation current signal.

Figure 10:
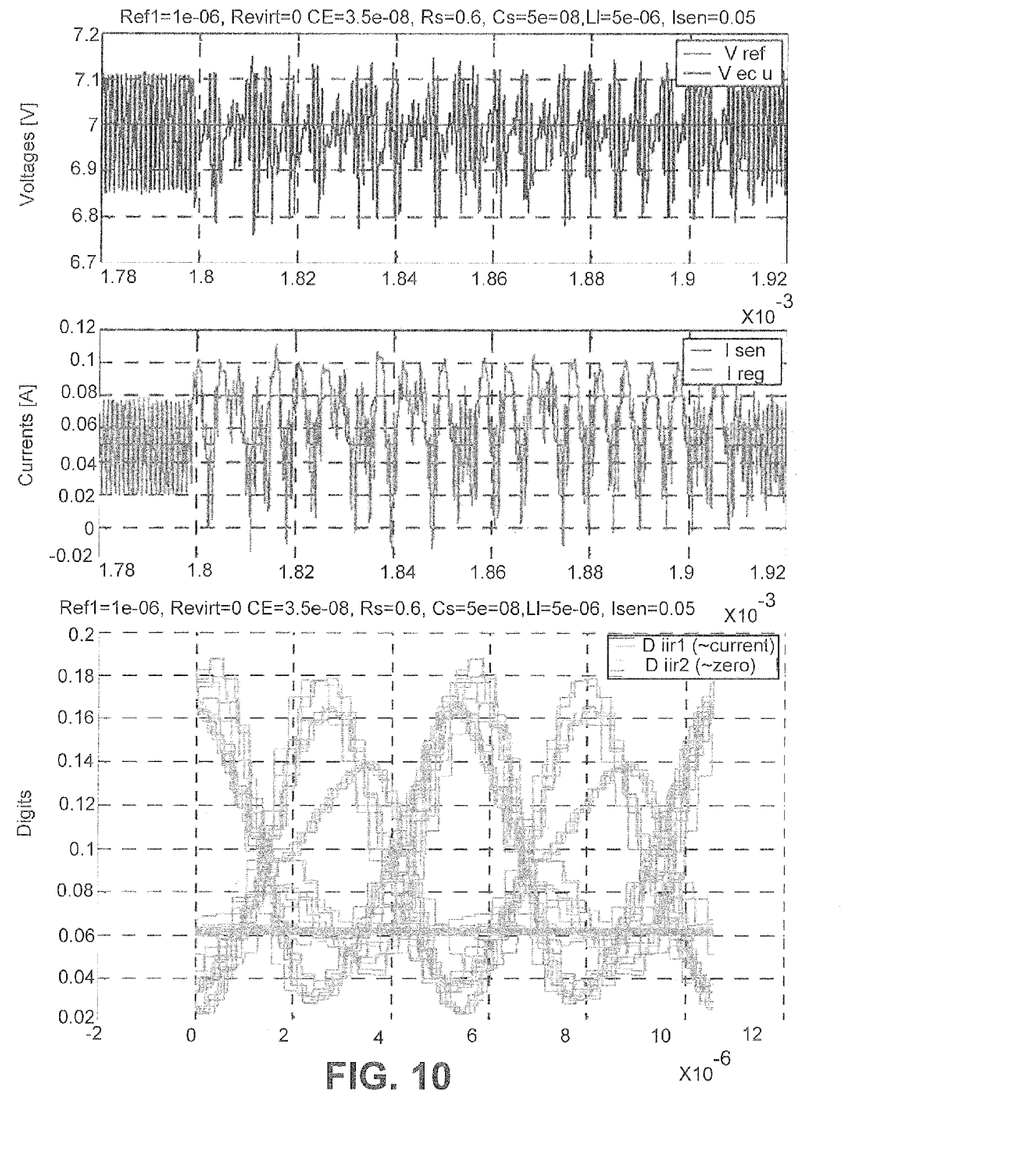
FIGS. 10-12 show simulation results for a PSI5 receiver that makes use of FIG. 9's modulation unit.
Figure 11:
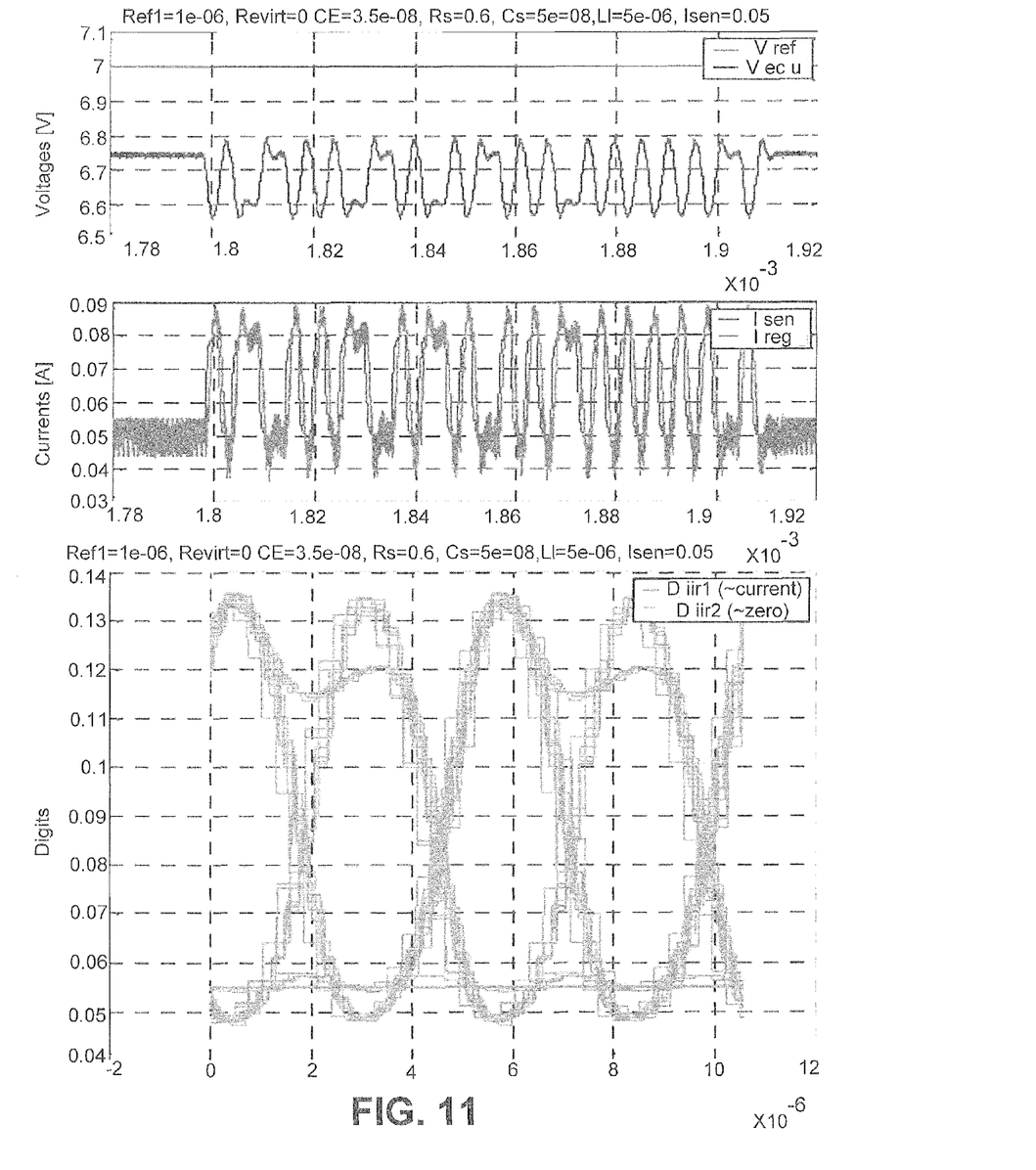
Figure 12:
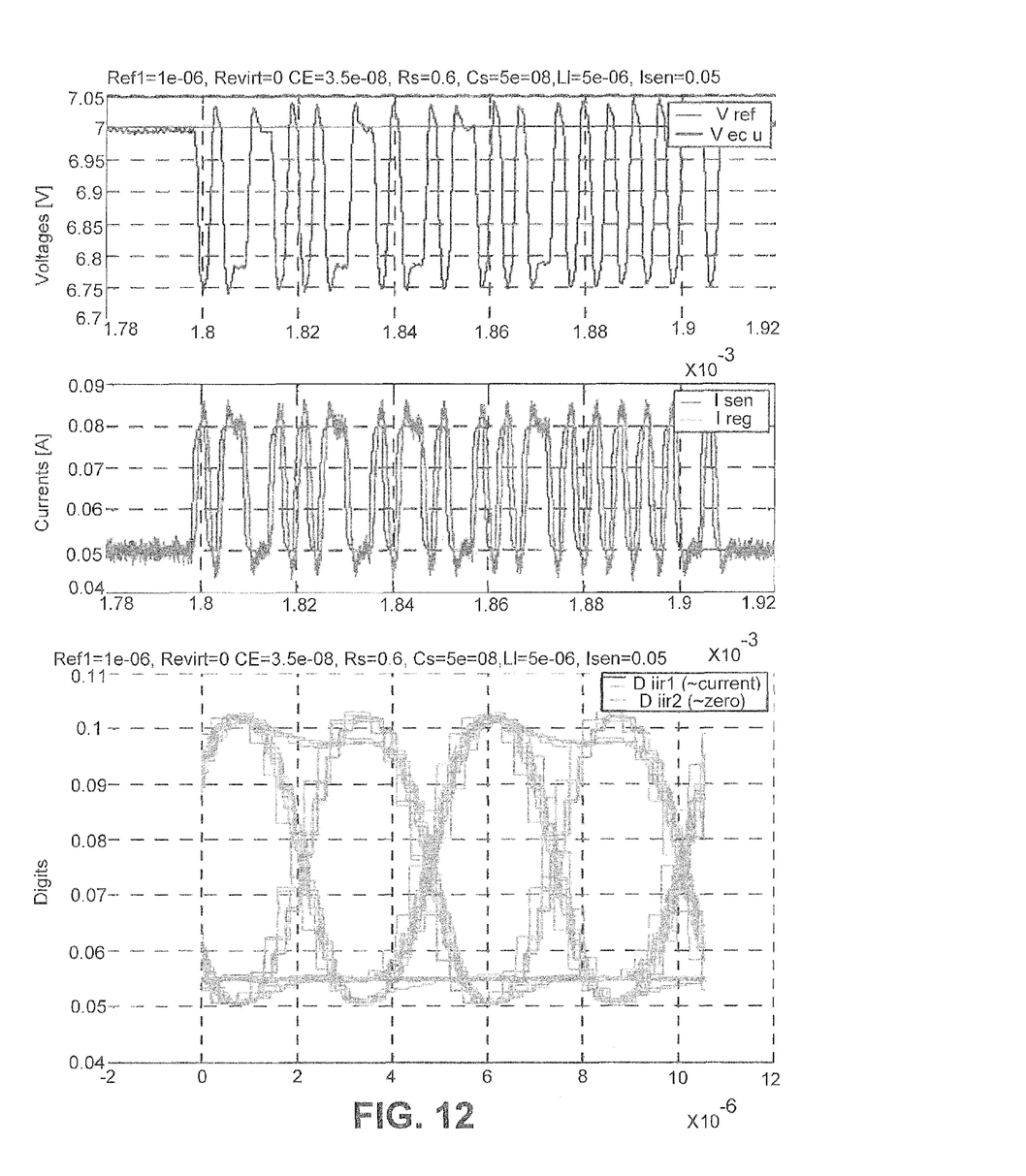

FIGS. 10-12 show simulation results for a PSI5 receiver that makes use of FIG. 9's modulation unit. For each of these figures, the upper left diagram includes a red curve and a blue curve. The red curve represents the reference voltage that serves as lead value for the controller, while the blue curve represents the output value of the modulation unit. Each of the lower left diagrams in these figures includes a red curve representing the Manchester modulated current transmitted by the sensor and a magenta curve representing current delivered by the control unit. The right diagram in each figure is an eye diagram, wherein the opening (white area) of the inner eye between the overlaid receive curves gives a measure for the quality of the received signal. The larger the eye in x- & y-direction, the better the receive signal quality.

FIG. 10's example sets the real resistor $R_E$ and the virtual resistance value $R_{EVI}$ to zero in order to demonstrate the effect of the load resonance on the modulated currents. The simulation result illustrates that receiving the transmitted patter from the modulated current signal will be difficult. Furthermore it shows that the sensor supply voltage equals the target value $V_{ref}$ before and after the regulation pattern when the sensor consumes its quiescence current, but exhibits a high level of higher frequency distortion.

FIG. 11's example uses only the real resistor $R_E$ (i.e., the virtual resistance value $R_{EVI}$ is set to zero). The simulation result illustrates that receiving the transmitted patter from the modulated current signal is straightforward. Furthermore it shows that the sensor supply voltage stays below the target value $V_{ref}$ during quiescence current consumption periods of the sensor due to the DC voltage drop across the resistor $R_E$.

FIG. 12's example uses a non-zero virtual resistance value without a real resistor $R_E$ in place. The simulation illustrates that receiving the transmitted patter from the modulated current signal is straightforward. Furthermore it shows that the sensor supply voltage reaches the target value $V_{ref}$ during quiescence current consumption periods of the sensor and avoids additional power consumtion due to the voltage drop across a real resistor in the current path.

Although the disclosure has been shown and described with respect to one or more implementations, equivalent alterations and modifications will occur to others skilled in the art based upon a reading and understanding of this specification and the annexed drawings Further, it will be appreciated that identifiers such as "first" and "second" do not imply any type of ordering or placement with respect to other elements; but rather "first" and "second" and other similar identifiers are just generic identifiers. In addition, it will be appreciated that the term "coupled" includes direct and indirect coupling. The disclosure includes all such modifications and alterations and is limited only by the scope of the following claims. In particular regard to the various functions performed by the above described components (e.g., elements and/or resources), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. In addition, the articles "a" and "an" as used in this application and the appended claims are to be construed to mean "one or more".

Furthermore, to the extent that the terms "includes", "having", "has", "with", or variants thereof are used in either the detailed description or the claims, such terms are intended to be inclusive in a manner similar to the term "comprising."

What is claimed is:

1. A sensor interface module comprising;
   a comparator having a first comparator input, a second comparator input, and a comparator output;
   a current- or voltage-control element having a control terminal coupled to the comparator output and having an output configured to deliver a modulated current or modulated voltage signal to an output of the sensor interface module;
   a first feedback path that provides the modulated current or voltage signal from the output of the current- or voltage-control element to the first comparator input;
   a summation element having a first summation input, a second summation input, and a summation output, the summation output coupled to the second comparator input;
   a supply voltage module configured to provide a supply voltage signal to the first summation input; and
   a second feedback path coupling the comparator output to the second summation input.

2. The sensor interface module of claim 1, further comprising a virtual resistance element on the second feedback path.

3. The sensor interface module of claim 2, wherein the virtual resistance element comprises:
   a multiplier disposed on the second feedback path, wherein the multiplier is configured to provide a multiplied signal to the second summation input based on a multiplication of a signal on the first feedback path with a virtual resistance value.

4. The sensor interface module of claim 3, wherein the virtual resistance value is a fixed, predetermined value.

5. The sensor interface module of claim 3, wherein the virtual resistance value changes as a function of the signal on the first feedback path.

6. The sensor interface module of claim 3, wherein the virtual resistance value is changed at a rising or falling edge of the modulated current or modulated voltage signal.

7. The sensor interface module of claim 3, wherein the virtual resistance value changes non-linearly based on the signal on the first feedback path.

8. The sensor interface module of claim 3, further comprising:

a high pass filter upstream or downstream of the multiplier on the second feedback path.

9. The sensor interface module of claim 3, further comprising:
a voltage drop limiting element downstream or upstream of the multiplier on the second feedback path and configured to limit a voltage drop.

10. The sensor interface module of claim 3, further comprising:
a second multiplier configured to provide a second multiplied signal based on the virtual resistance value and a current threshold value; and
a voltage drop limiting element downstream of the multiplier on the second feedback path and configured to limit a voltage drop based on the second multiplied signal.

11. The sensor interface module of claim 1, further comprising:
a PID controller comprising an PID input and a PID output, wherein the PID input is coupled to the comparator output and the PID output is coupled to the control terminal of the current- or voltage-control element.

12. The sensor interface module of claim 11, wherein the current- or voltage-control element comprises:
first and second variable current elements arranged in series on a current path;
wherein the control terminals of the first and second variable current elements are coupled to the output of the PID controller and wherein the output of the current- or- voltage control element is disposed on the current path between the first and second variable current elements.

13. A sensor interface module comprising:
a comparator having a first comparator input, a second comparator input, and a comparator output;
a current- or voltage-control element having a control terminal coupled to the comparator output and having an output configured to deliver a modulated current or modulated voltage signal to an output of the sensor interface module;
a first feedback path that provides the modulated current or voltage signal from the output of the current- or voltage-control element to the first comparator input;
a second feedback path coupling the comparator output to the second comparator input; and
a virtual resistance element on the second feedback path.

14. The sensor interface module of claim 13, wherein the virtual resistance element comprises:
a multiplier disposed on the second feedback path, wherein the multiplier is configured to provide a multiplied signal to the second comparator input based on a multiplication of a signal on the first feedback path with a virtual resistance value.

15. The sensor interface module of claim 14, further comprising:
a high pass filter upstream or downstream of the multiplier on the second feedback path.

16. The sensor interface module of claim 14, further comprising:
a voltage drop limiting element downstream or upstream of the multiplier on the second feedback path and configured to limit a voltage drop.

17. The sensor interface module of claim 14, further comprising:
a second multiplier configured to provide a second multiplied signal based on the virtual resistance value and a current threshold value; and
a voltage drop limiting element downstream of the multiplier on the second feedback path and configured to limit a voltage drop based on the second multiplied signal.

18. The sensor interface module of claim 13, wherein the virtual resistance element is represented by a fixed, predetermined digital value.

19. The sensor interface module of claim 13, wherein the virtual resistance element is represented by a digital value that changes as a function of a signal on the first feedback path.

20. The sensor interface module of claim 19, wherein the digital value changes non-linearly based on the signal on the first feedback path.

* * * * *